United States Patent
Ito

(10) Patent No.: US 6,661,672 B2
(45) Date of Patent: Dec. 9, 2003

(54) ELECTRIC CONNECTION BOX

(75) Inventor: Katsuya Ito, Yokkaichi (JP)

(73) Assignee: Sumitomo Wiring Systems, Ltd., Mei (JP)

( * ) Notice: Subject to any disclaimer, the term of this patent is extended or adjusted under 35 U.S.C. 154(b) by 0 days.

(21) Appl. No.: 10/351,545

(22) Filed: Jan. 27, 2003

(65) Prior Publication Data

US 2003/0198030 A1 Oct. 23, 2003

(30) Foreign Application Priority Data

Apr. 19, 2002 (JP) ........................................ 2002-117284

(51) Int. Cl.$^7$ ................................................. H05K 5/06
(52) U.S. Cl. ........................ 361/752; 361/775; 361/611; 439/212; 439/721; 439/949
(58) Field of Search ................................ 361/752, 775, 361/611, 637, 648; 439/76.2, 212, 701, 709, 721, 724, 949

(56) References Cited

U.S. PATENT DOCUMENTS

| | | | |
|---|---|---|---|
| 5,322,445 A | * | 6/1994 | Ozaki et al. ................. 439/212 |
| 5,624,280 A | * | 4/1997 | Kato ........................... 439/724 |
| 5,626,492 A | * | 5/1997 | Onizuka et al. ............. 439/512 |
| 6,383,035 B1 | * | 5/2002 | Kasai .......................... 439/724 |

FOREIGN PATENT DOCUMENTS

| JP | A 7-184311 | 7/1998 |
|---|---|---|
| JP | A 2000-201416 | 7/2000 |

* cited by examiner

Primary Examiner—David Martin
Assistant Examiner—Thanh S. Phan
(74) Attorney, Agent, or Firm—Oliff & Berridge, PLC

(57) ABSTRACT

An electric connection box having a circuit formed inside a case (upper case) by arranging vertical bus bars in parallel inside the case. Terminals project from one side of each of the vertical bus bars. Pressure welding tabs having a pressure-welding slot respectively and pressure-welding pieces project from the other side of each of the vertical bus bars, with the pressure welding tabs and the pressure-welding pieces vertical to a longitudinal direction of the vertical bus bars. The vertical bus bars are arranged in parallel, and the pressure-welding piece of the vertical bus bar is connected by pressure welding to the pressure-welding slot of the pressure-welding tab.

5 Claims, 6 Drawing Sheets

ELECTRIC CONNECTION BOX

BACKGROUND OF THE INVENTION

1. Field of Invention

The present invention relates to an electric connection box and more particularly to an electric connection box arranging a plurality of vertical bus bars in parallel inside a case, in which the vertical bus bars are electrically preferably connected to each other. The present application claims priority to Japanese Application No. 2002-117284 filed Apr. 19, 2002.

2. Description of Related Art

The present applicant proposed an electric connection box disclosed in Japanese Patent Application Laid-Open No. 2001-145231. As shown in FIG. 7, vertical bus bars 1 are accommodated in parallel upright in a plurality of vertical bus bar accommodation grooves 2a arranged in parallel in a case 2.

Male terminals 1b are formed to project at required intervals on one side of each vertical bus bar 1. Pressure-welding tabs 1a each having a pressure-welding slot 1a–1 are formed to project at required intervals on the other side of each vertical bus bar 1. The vertical bus bars 1 are used by cutting unnecessary portions thereof.

Electric wires w are connected by pressure welding to the pressure-welding tabs 1a arranged in parallel to electrically connect the adjacent vertical bus bars 1 to each other. However, in the above-described electric connection box, the electric wires w are required to electrically connect the adjacent vertical bus bars 1 to each other. Therefore, the electric connection box necessitates the number of component parts to be increased.

Further the electric wires w are connected by pressure welding to the pressure-welding slots 1a–1 of the pressure-welding tabs 1a. Thus, equipment and a process for connecting the electric wires w to the pressure-welding tabs 1a are required. Consequently, the manufacturing cost of the electric connection box is high.

SUMMARY OF THE INVENTION

The present invention has been made in view of the above-described problem. Accordingly, it is an object of the present invention to connect vertical bus bars to each other without using electric wires to thereby decrease the number of component parts and manufacturing processes.

To achieve the object, according to the present invention, there is provided an electric connection box having a circuit formed inside a case (upper case) by arranging vertical bus bars in parallel inside the case. Terminals project from one side of each of the vertical bus bars. Pressure welding tabs each having a pressure-welding slot and pressure-welding pieces project from the other side of each of the vertical bus bars, with the pressure welding tabs and the pressure-welding pieces vertical to a longitudinal direction of the vertical bus bars. The vertical bus bars are arranged in parallel, and the pressure-welding piece of the vertical bus bar is connected by pressure welding to the pressure-welding slot of the pressure-welding tab.

The above-described construction eliminates the need for use of electric wires in connecting the vertical bus bars arranged in parallel. The pressure-welding piece of one vertical bus bar is connected to the pressure-welding slot of the other vertical bus bar by pressure welding. It is possible to decrease the number of component parts thereby.

The vertical bus bars are arranged in parallel, and the pressure-welding piece is connected by pressure welding to the pressure-welding slot. This construction eliminates the need for a pressure-welding operation of connecting electric wires to the pressure-welding tab, unlike the conventional art. Therefore, it is possible to decrease the number of manufacturing processes and eliminate the need for using an apparatus for connecting the electric wires to the pressure-welding tab.

It is preferable that the pressure welding tabs and the pressure-welding pieces project alternately from the upper or lower side of each of the vertical bus bars, with the pressure welding tabs and the pressure-welding pieces spaced at required intervals. It is also preferable that the terminals, to be connected to the external circuit, project from the upper or lower side of each of the vertical bus bars at required intervals.

It is preferable that the length of each vertical bus bar, in a longitudinal direction thereof, is divided into a plurality of sections at required positions thereof, according to a circuit construction. That is, manufacture of the vertical bus bars includes the pressure-welding tabs and the pressure-welding pieces formed alternately thereon. In accommodating the vertical bus bars in the electric connection box, each of the vertical bus bars is divided into a plurality of sections at required positions in conformity to a specification of a circuit to be formed so that each of the vertical bus bars has a desired configuration. It is possible to decrease the number of types of the vertical bus bar, thereby.

Such a design easily facilitates alteration of the construction of the circuit of the electric connection box by merely changing the dividing position of each of the vertical bus bars or the pressure-welding position thereof.

DETAILED DESCRIPTION OF PREFERRED EMBODIMENTS

The embodiments of the present invention will be described below with reference to drawings.

FIGS. 1 through 4 show a first embodiment. An electric connection box of the first embodiment is a junction block 15 including an upper case 13 accommodating a large number of vertical bus bars 10 and 11 arranged in parallel, and a lower case 14 put on the upper case 13.

Figure 2:
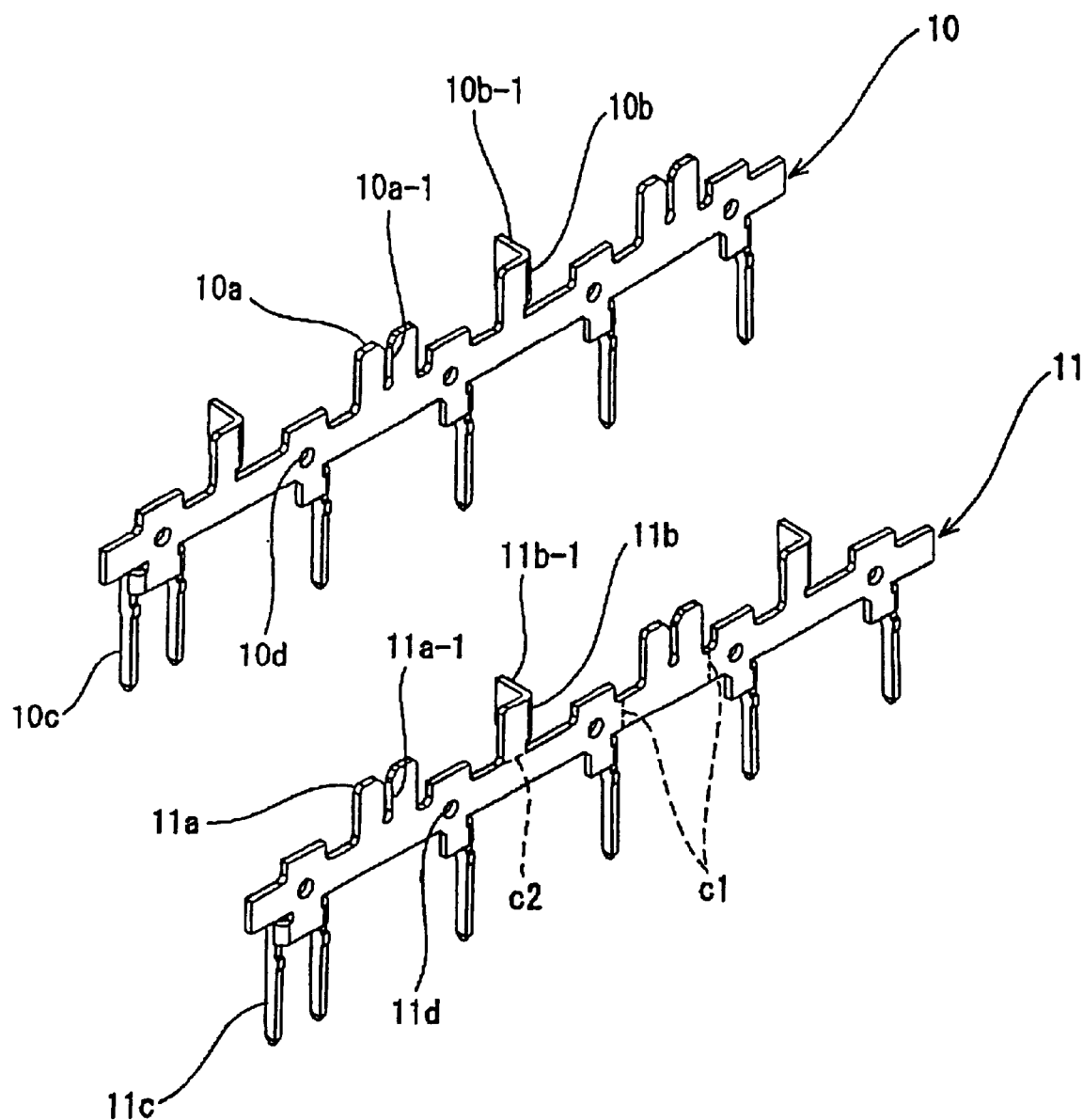
FIG. 2 is a perspective view showing vertical bus bars according to the first embodiment of the present invention.

The vertical bus bar consists of two types. As shown in FIG. 2, the long and narrow vertical bus bar 10 has six male terminals 10c projecting from one side thereof. Two pressure-welding pieces 10b each having an approximately L-shaped bent part 10b–1 and two pressure-welding tabs 10a each having a pressure-welding slot 10a–1 project from the other side of the vertical bus bar 10, with the pressure-welding pieces 10b and the pressure-welding tabs 10a alternating with each other at certain intervals. Lance parts 10d are formed on a side surface of the long and narrow vertical bus bar 10 at its required positions, with the lance parts 10d spaced at certain intervals.

The other vertical bus bar 11 has a construction similar to that of the vertical bus bar 10 except that the pressure-welding pieces 11b of the vertical bus bar 11 are formed at the positions of the pressure-welding tabs 11a of the vertical bus bar 10, and the pressure-welding tabs 11a of the vertical bus bar 11 are formed at the positions of the pressure-welding pieces 11b of the vertical bus bar 10. Similarly to the vertical bus bar 10, six male terminals 11c project from one side of the vertical bus bar 11. Lance parts 11d are formed on a side surface of the vertical bus bar 11 at its required positions, with the lance parts 11d spaced at certain intervals.

At required positions of the vertical bus bars 10 and 11, they are divided into a plurality of sections to form a circuit in conformity to the specification of the junction block.

For example, as shown in FIG. 2, an unnecessary portion of the vertical bus bar 11 is cut at a cutting portion C1 to divide the vertical bus bar 11 into two sections, and an unnecessary pressure-welding piece 11b is removed from the vertical bus bar 11 by cutting the unnecessary pressure-welding piece 11b at a cutting portion C2. In this manner, unnecessary portions are removed from the vertical bus bar 10 to form the vertical bus bar 10 into a required configuration.

The upper case 13 has a large number of accommodation grooves 13a formed on its inner surface to accommodate the vertical bus bars 10 and 11, a connector accommodation part 13b formed on its upper side, and locking claws 13c formed at required positions of its side surfaces.

The lower case 14 has a configuration to cover the inner surface of the upper case 13. The lower case 14 has a to-be-locked portion 14a formed at positions corresponding to the positions of the locking claws 13c of the upper case 13.

Figure 1:
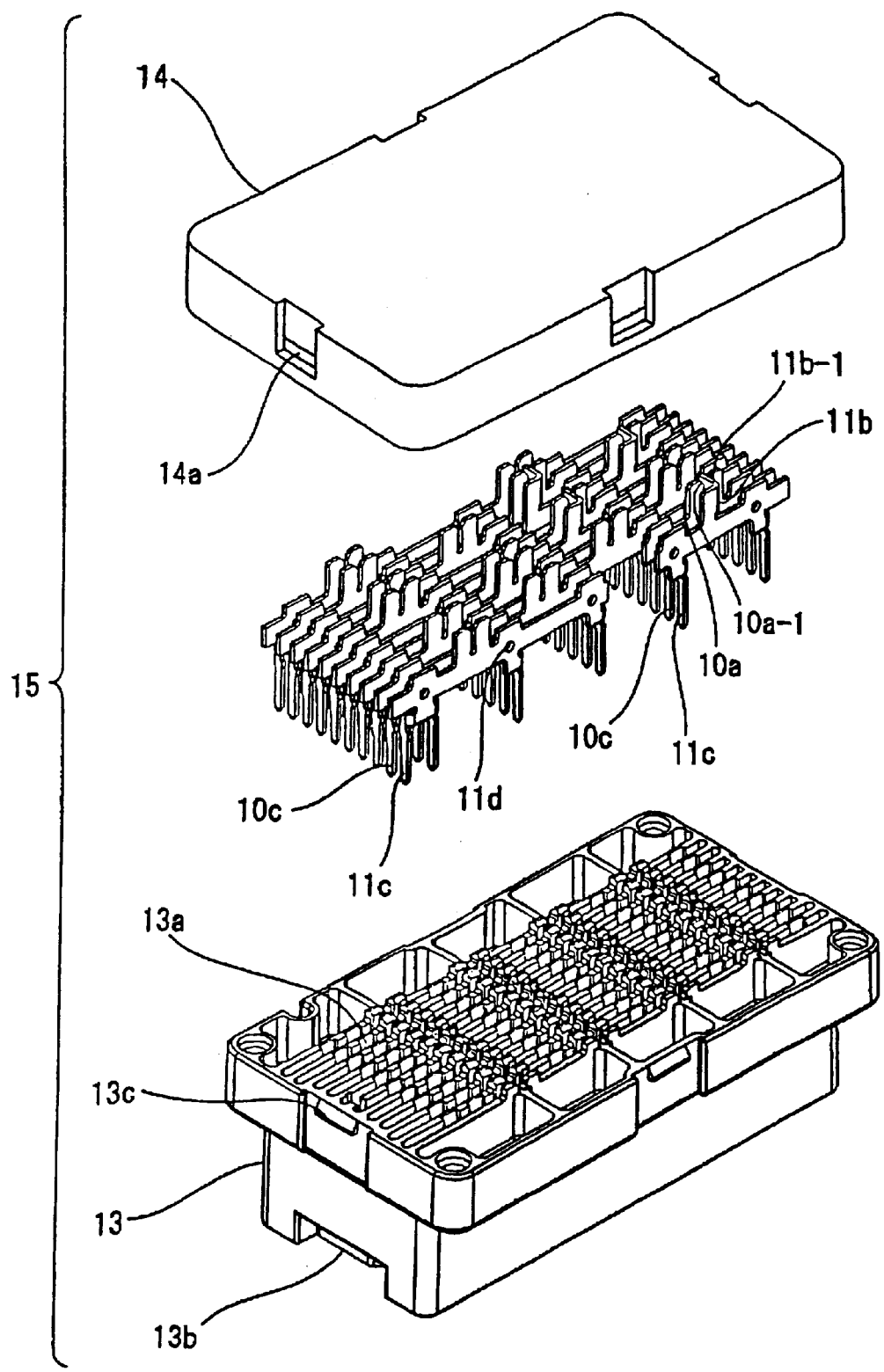
FIG. 1 is an exploded perspective view showing a junction block (electric connection box) according to a first embodiment of the present invention.
Figure 4:
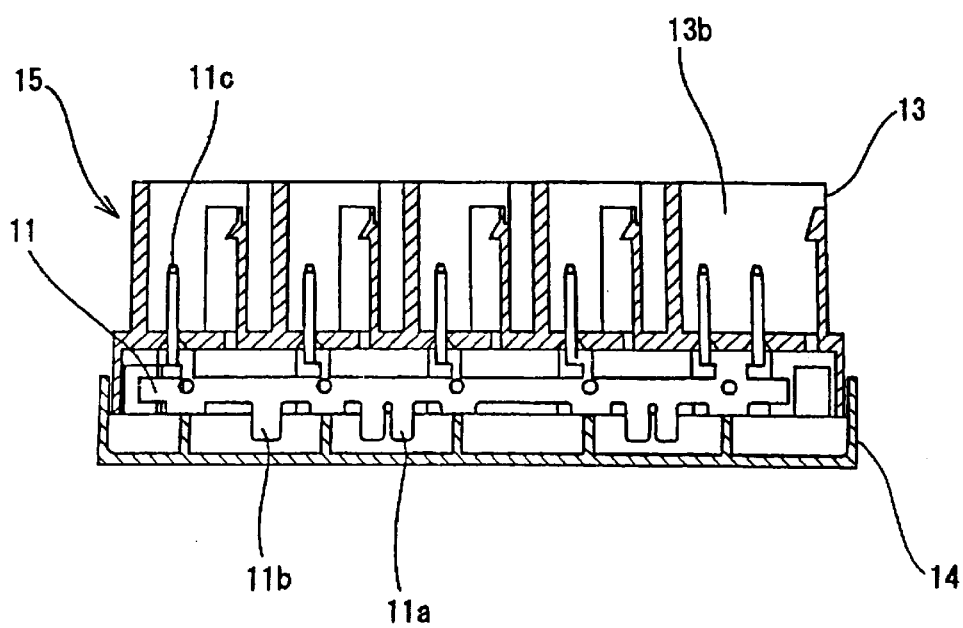
FIG. 4 is a sectional view showing a junction block according to the first embodiment of the present invention.

The procedure of assembling the junction block 15 is described below. As shown in FIG. 1, after a plurality of the vertical bus bars 10 and 11 are arranged in parallel in a required order, adjacent vertical bus bars 10 and 11 are connected to each other by pressure welding. Thereafter the vertical bus bars 10 and 11 connected to each other are inserted into the accommodation groove 13a disposed on the inner surface of the upper case 13, with the male terminals 10c and 11c disposed forward. Thereby as shown in FIG. 4, the male terminals 10c and 11c project upward into the connector accommodation part 13b.

Figure 3:
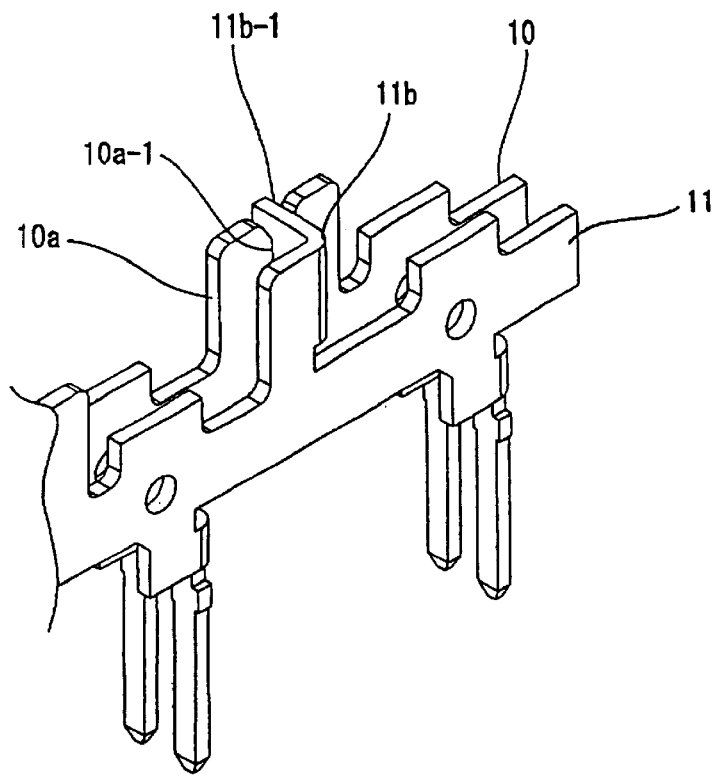
FIG. 3 is a main parts-enlarged view showing a state in which the vertical bus bars are connected to each other according to the first embodiment of the present invention.

More specifically, the vertical bus bars 10 and 11 are arranged in parallel. As shown in FIG. 3, the bent part 11b–1 disposed at the upper (in FIG. 3) end of the pressure-welding piece 11b of the vertical bus bar 11 is connected to the adjacent pressure-welding slot 10a–1 of the pressure-welding tab 10a of the vertical bus bar 10.

The vertical bus bars 10 and 11 are arranged in parallel in this manner, and the pressure-welding pieces 11b and 10b are connected by pressure welding to the adjacent pressure-welding tabs 10a and 11a respectively disposed at required positions to electrically connect the vertical bus bars 10 and 11 to each other.

The above-described construction eliminates the need for use of additional component parts such as electric wires in connecting the vertical bus bars 10 and 11 arranged in parallel. Thereby it is possible to decrease the number of component parts.

The vertical bus bars 10 and 11 are arranged in parallel in this manner, and the bent part 10b–1 of the pressure-welding piece 10b and the bent part 11b–1 of the pressure-welding piece 11b are connected by pressure welding to the pressure-welding slot 10a–1 of the pressure-welding tab 10a and the pressure-welding slot 11a–1 of the pressure-welding tab 11a respectively. This construction eliminates the need for a pressure-welding operation of connecting electric wires to pressure-welding tabs, unlike the conventional art. Therefore, it is possible to decrease the number of manufacturing processes and eliminate the need for using an apparatus for connecting the electric wires to the pressure-welding tabs by pressure welding.

The pressure-welding tab and the pressure-welding piece are arranged in the vertical bus bars 10 and 11 in such a way that the pressure-welding tab of the vertical bus bar 10 and the pressure-welding piece of the vertical bus bar 11 are connected to each other and that the pressure-welding tab of the vertical bus bar 11 and the pressure-welding piece of the vertical bus bar 10 are connected to each other. Thus only two types of the vertical bus bars are used. Therefore, it is possible to enhance versatility of the vertical bus bars 10 and 11 and decrease the number of types of the vertical bus bar. In accommodating the vertical bus bars 10 and 11 in the junction block 15, each of the vertical bus bars 10 and 11 is divided into a plurality of sections at required positions in conformity to a specification of a circuit to be formed so that each of the vertical bus bars 10 and 11 has a desired configuration.

Alteration of the circuit construction is facilitated owing to alteration of the specification of the junction block 15 by merely changing the dividing position of the vertical bus bars 10 and 11 or the pressure-welding position of the vertical bus bars 10 and 11.

Figure 5:
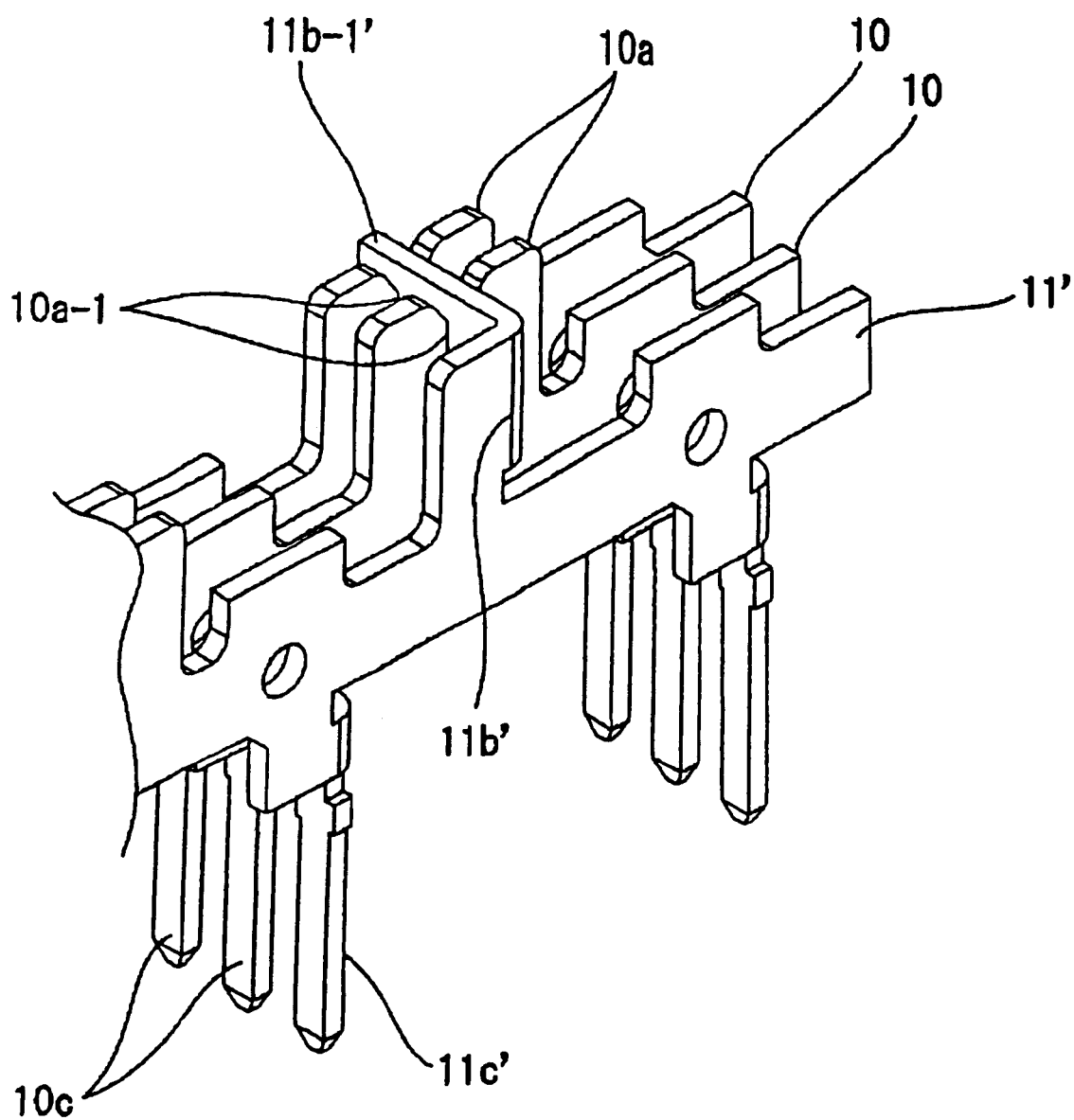
FIG. 5 is a main parts-enlarged view showing a state in which vertical bus bars, according to a second embodiment, are connected to each other.

FIG. 5 shows a second embodiment different from the first embodiment in that one pressure-welding piece 11b' is connected to a plurality of pressure-welding tabs 10a by pressure welding.

In a vertical bus bar 11', a bent part 11b–1' of the approximately L-shaped pressure-welding piece 11b' disposed at an upper end (in FIG. 5) thereof is set longer than the pressure-welding piece 11b of the first embodiment.

As shown in FIG. 5, the bent part 11b–1' of the pressure-welding piece 11b' of the vertical bus bar 11' is connected to the pressure-welding slot 10a–1 of the pressure-welding tab 10a of each of the adjacent two vertical bus bars 10 by pressure welding.

This construction allows a transverse electrical connection between one pressure-welding piece 11b' and a plurality of the pressure-welding tabs 10a.

Needless to say, the length of the bent part of the pressure-welding piece can be set longer according to a required number of the pressure-welding tabs to be connected to the pressure-welding piece.

Because other constructions of the second embodiment are similar to those of the first embodiment, description thereof is omitted herein.

Figure 6:
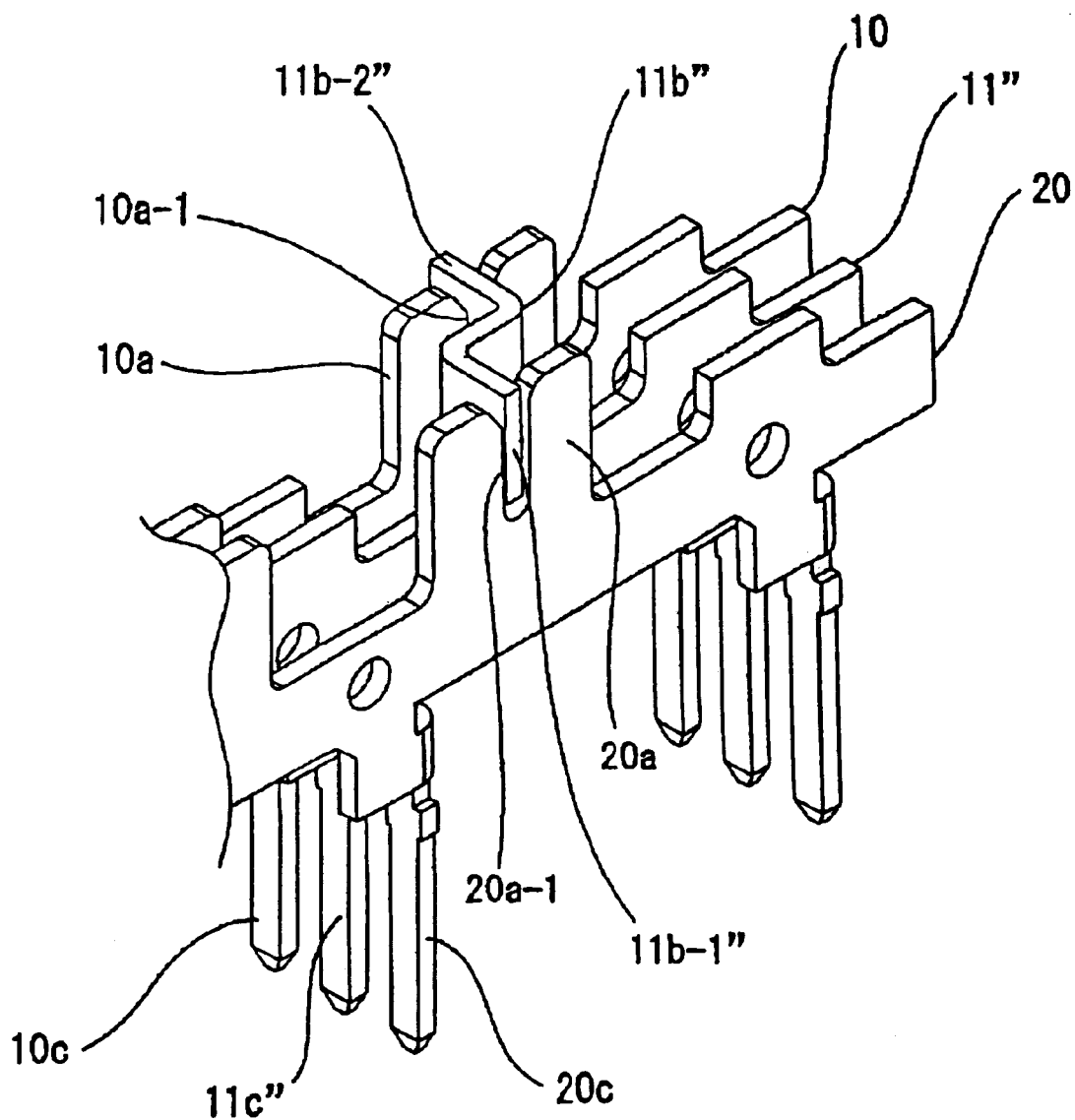
FIG. 6 is a main parts-enlarged view showing a state in which vertical bus bars, according to a third embodiment, are connected to each other.
Figure 7:
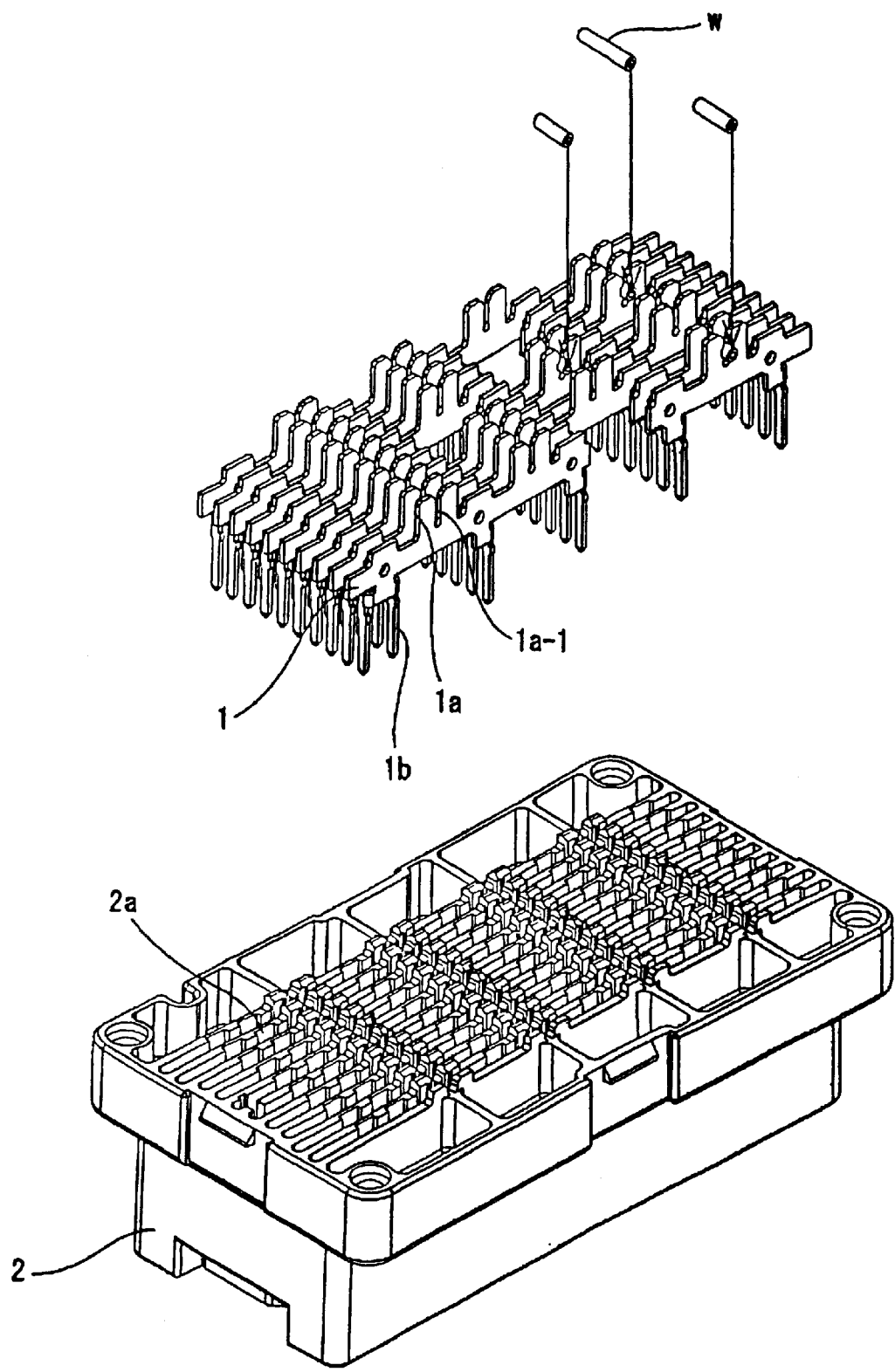
FIG. 7 shows a conventional junction box according to the conventional art.

FIG. 6 shows a third embodiment different from the second embodiment in that by pressure welding, a pressure-welding piece 11b" is connected to the vertical bus bar 10 adjacently disposed at one side of the vertical bus bar 11" and to a vertical bus bar 20 adjacently disposed at the other side of the vertical bus bar 11".

The pressure-welding piece 11b" of the vertical bus bar 11" is bent in the shape of an approximately "N". A pair of bent parts 11b–1" and 11b–2" is formed to project at either side of the pressure-welding piece 11b" of the vertical bus bar 11".

The one bent part 11b–1" of the pressure-welding piece 11b" of the vertical bus bar 11" is connected to a pressure-welding slot 20a–1 of a pressure-welding tab 20a of the vertical bus bar 20 adjacent to the vertical bus bar 11" by pressure welding. The other bent part 11b–2" is connected by pressure welding to the pressure-welding slot 10a–1 of the pressure-welding tab 10a of the vertical bus bar 10 adjacent to the vertical bus bar 11".

Needless to say, the length of each of a pair of the bent parts 11b–1" and 11b–2" formed to project at either side of the pressure-welding piece 11b" is arranged lengthwise to connect the bent part 11b–1" to the pressure-welding tabs 20a of a large number of the vertical bus bars 20 and the bent part 11b–2" to the pressure-welding tabs 10a of a large number of the vertical bus bars 10.

Because other constructions of the third embodiment are similar to those of the first embodiment, description thereof is omitted herein.

As apparent from the foregoing description, according to the present invention, the above-described construction eliminates the need for use of additional component parts such as electric wires in connecting the vertical bus bars arranged in parallel in the electric connection box. Thus it is possible to decrease the number of component parts.

The vertical bus bars are arranged in parallel, and the pressure-welding piece is connected by pressure welding to the pressure-welding slot. This construction eliminates the need for a pressure-welding operation of connecting electric wires to the pressure-welding tab, unlike the conventional art. Therefore, it is possible to decrease the number of manufacturing processes and eliminate the need for using an apparatus for connecting the electric wires to the pressure-welding tab.

The vertical bus bars are arranged in parallel, and the pressure-welding piece is connected by pressure welding to the pressure-welding slot. This construction eliminates the need for a pressure-welding operation of connecting electric wires to the pressure-welding tab, unlike the conventional art. Therefore, it is possible to decrease the number of manufacturing processes and eliminate the need for using an apparatus for connecting the electric wires to the pressure-welding tab.

The vertical bus bars each having the pressure-welding tabs, and the pressure-welding pieces formed thereon alternately is manufactured. It is possible to enhance versatility of the vertical bus bars and decrease the number of types of the vertical bus bar. In accommodating the vertical bus bars in the electric connection box, each of the vertical bus bars is divided into a plurality of sections at required positions in conformity to a specification of a circuit to be formed so that each of the vertical bus bars has a desired configuration.

Alteration of the circuit of the electric connection box is facilitated owing to alteration of the specification of the electric connection box by merely changing the dividing position of each of the vertical bus bars or the pressure-welding position thereof.

While this invention has been described in conjunction with the specific embodiments above, it is evident that many alternatives, combinations, modifications, and variations are apparent to those skilled in the art. Accordingly, the exemplary embodiments of this invention, as set forth above are intended to be illustrative, and not limiting. Various changes can be made without departing from the spirit and scope of this invention.

What is claimed is:

1. An electric connection box having a circuit formed inside a case by arranging a plurality of vertical bus bars in parallel inside said case, comprising:

a terminal, connected to an external circuit, projecting from a first side of each vertical bus bar of said vertical bus bars;

a pressure welding tab, having a pressure-welding slot and projecting from a second side of said each vertical bus bar; and a pressure-welding piece bent in an "L" shape, the pressure welding tab and the pressure-welding piece projecting from said second side of said each vertical bus bar, wherein said first and second sides of said vertical bus bar are opposite each other, said pressure welding tab and said pressure-welding piece are spaced apart at certain intervals, and adjacent vertical bus bars of said plurality of vertical bus bars are connected to each other by connecting said pressure-welding piece of a first bar of said adjacent vertical bus bars to said pressure-welding slot of a second bar of said adjacent vertical bus bars.

2. The electric connection box according to claim 1, wherein a plurality of pressure welding tabs and a plurality of pressure-welding pieces project alternately from said second side of said each vertical bus bar, said pressure welding tabs and said pressure-welding pieces are spaced at required pressure-welding intervals, and a plurality of terminals, to be connected to said external circuit, project from said first side of said each vertical bus bar at required terminal intervals.

3. The electric connection box according to claim 2, wherein said vertical bus bars are divided into a plurality of sections at required positions in a longitudinal direction thereof, according to a circuit construction.

4. The electric connection box according to claim 1, wherein said vertical bus bars are divided into a plurality of sections at required positions in a longitudinal direction thereof, according to a circuit construction.

5. The electric connection box according to claim 1, wherein said first side of said each vertical bus bar is one of either an upper side and a lower side, and said second side of said each vertical bus bar is the other of either the upper side and the lower side.

* * * * *